(12) United States Patent
Morrison

(10) Patent No.: US 7,291,847 B2
(45) Date of Patent: Nov. 6, 2007

(54) SPECIMEN TIP AND TIP HOLDER ASSEMBLY

(75) Inventor: Robert Morrison, Wiltshire (GB)

(73) Assignee: Roper Industries, Ltd., Bury St. Edmunds (GB)

( * ) Notice: Subject to any disclaimer, the term of this patent is extended or adjusted under 35 U.S.C. 154(b) by 0 days.

(21) Appl. No.: 11/546,268

(22) Filed: Oct. 10, 2006

(65) Prior Publication Data

US 2007/0029481 A1 Feb. 8, 2007

(51) Int. Cl.
*G01F 23/00* (2006.01)

(52) U.S. Cl. .......................... 250/440.11; 250/441.11; 250/442.11; 250/311

(58) Field of Classification Search ...................... None
See application file for complete search history.

(56) References Cited

U.S. PATENT DOCUMENTS 5,367,171 A * 11/1994 Aoyama et al. ......... 250/443.1
5,977,543 A * 11/1999 Ihn et al. .................... 250/311
6,002,136 A * 12/1999 Naeem .................. 250/442.11

* cited by examiner

*Primary Examiner*—David Vanore
(74) *Attorney, Agent, or Firm*—Fenwick & West LLP

(57) ABSTRACT

A specimen tip holder assembly for mounting a specimen tip in a transmission electron microscope (TEM) is described. The specimen tip holder assembly comprises a tip holder for supporting a specimen tip. The tip holder is coupled to an elongate support for movement in a direction substantially perpendicular to the axis of the support. An actuator is mounted to the support for causing motion of the tip holder relative to the support.

15 Claims, 8 Drawing Sheets

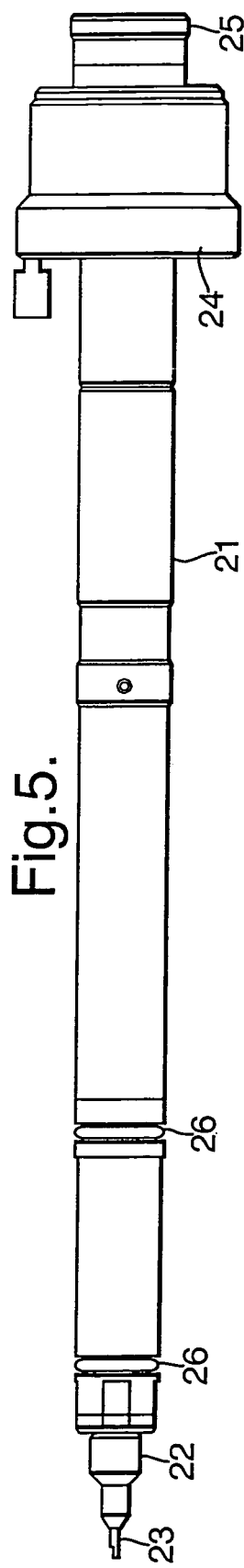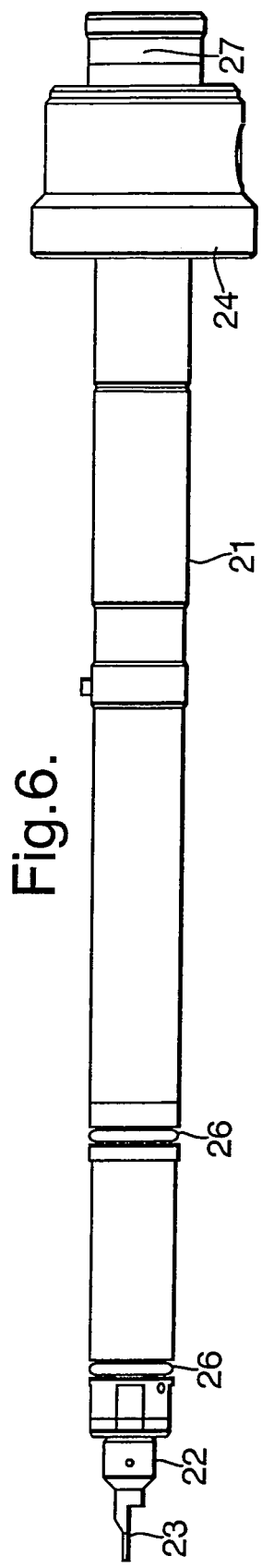

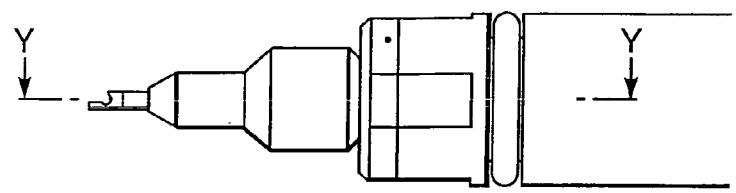
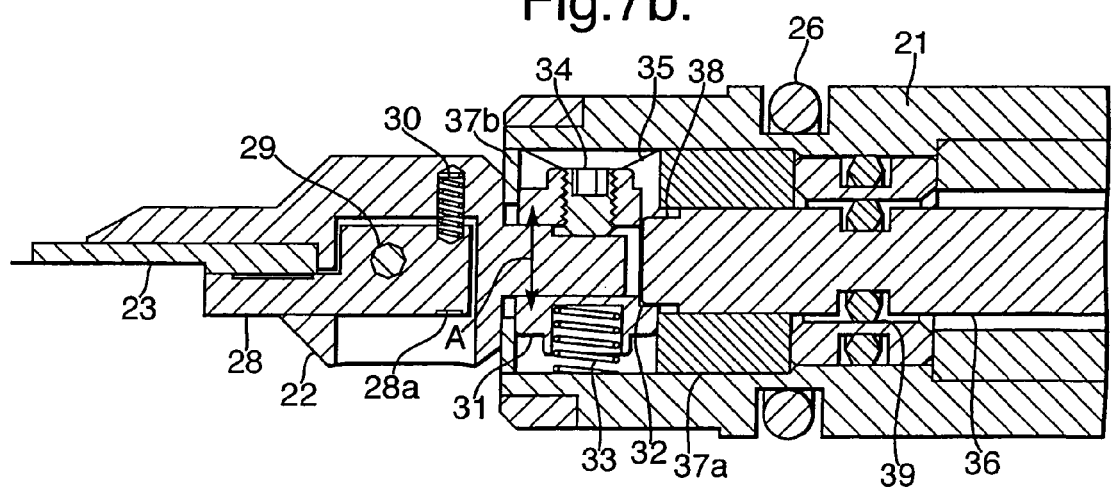

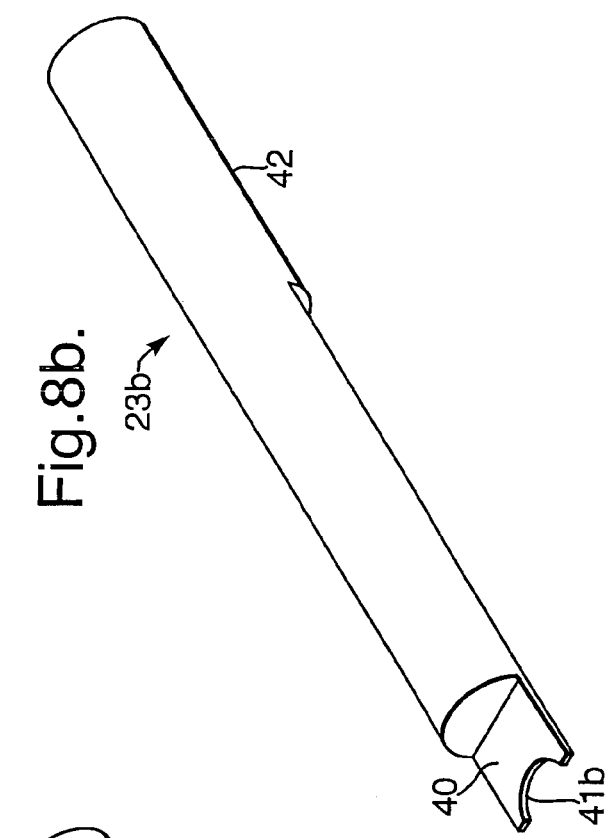
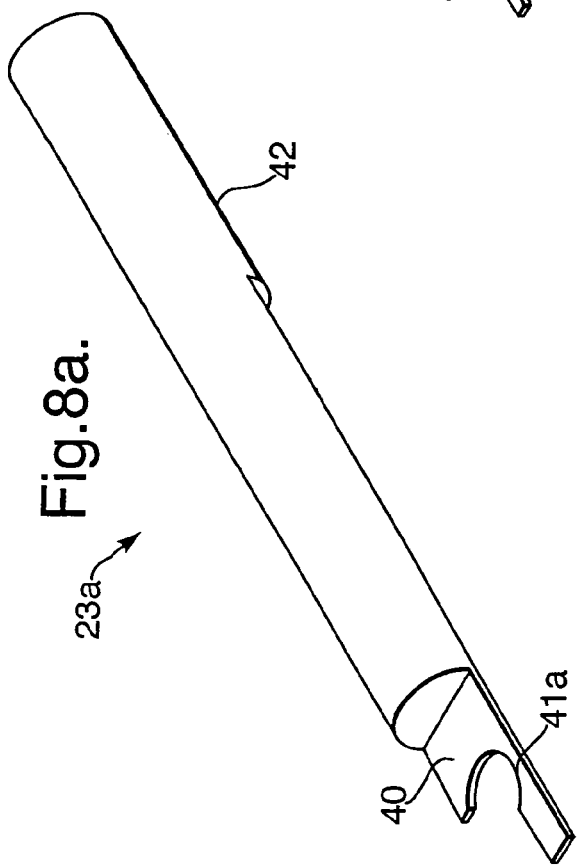

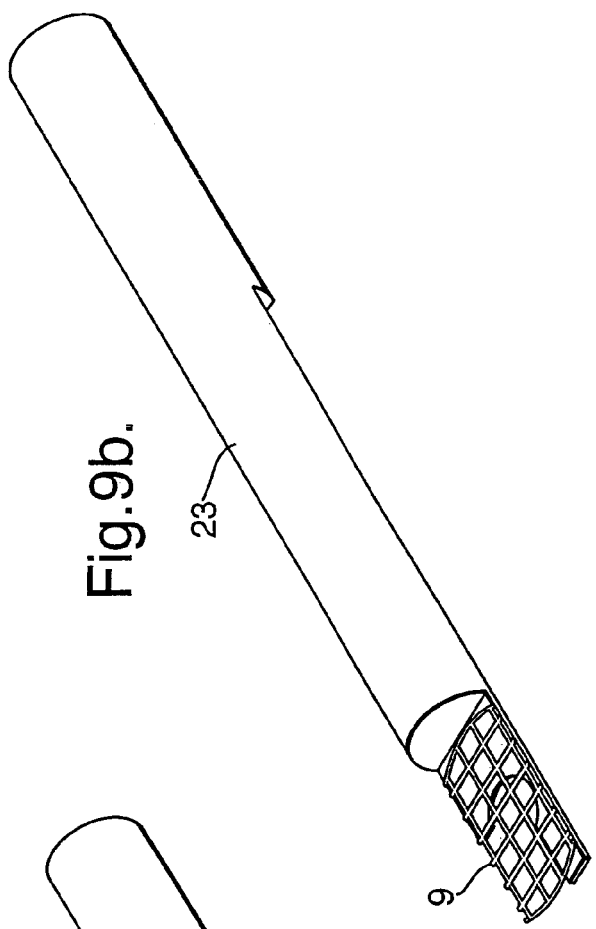
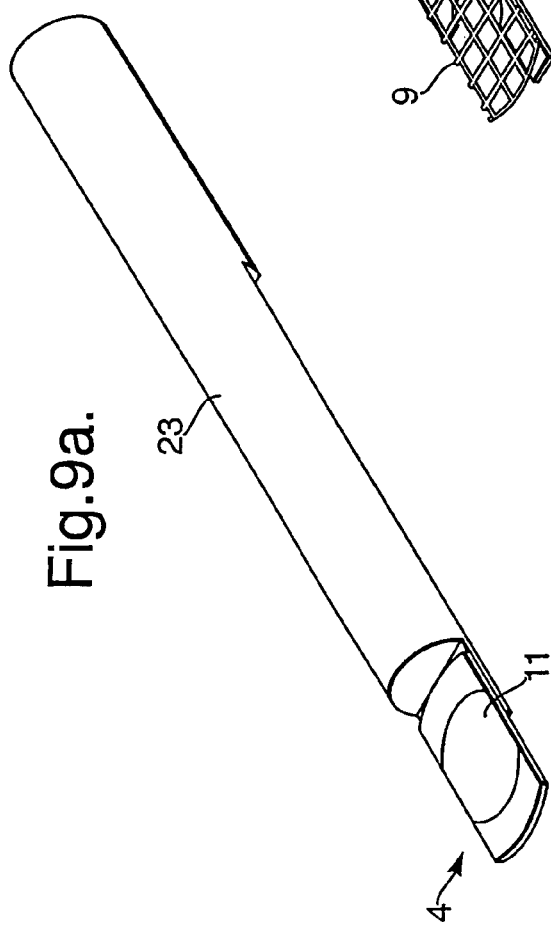

SPECIMEN TIP AND TIP HOLDER ASSEMBLY

RELATED APPLICATIONS

This application claims the benefit under 35 U.S.C. § 120 of prior application Ser. No. 10/903,985, filed on Jul. 30, 2004, by Robert Morrison, now abandoned, which prior application claims priority under 35 U.S.C. §119 from U.K. Ser. No. 0318134.4, filed on Aug. 1, 2003 by Robert Morrison.

FIELD OF THE INVENTION

This invention relates to specimen tips and tip holder assemblies for supporting a sample to be analysed in a transmission electron microscope. The invention further provides a method for mounting a specimen to a specimen tip.

BACKGROUND OF THE INVENTION

Transmission electron microscopy is a versatile tool widely used across a range of research areas from biology to physio-chemical subjects. The transmission electron microscope is one of the most effective imaging devices available and can be used to study not only the surface morphology but also the internal structure and defects in diverse materials including metals, semiconductors, proteins and polymers.

A schematic diagram illustrating the workings of a transmission electron microscope (TEM) is shown in FIG. 1. In essence, a TEM consists of an electron gun 1 which produces a high-energy beam of electrons, and a series of electromagnetic lenses 2 which control and collimate the beam along the optic axis A-A onto a specimen under investigation. A thin sample 4 (~100 nm thick) is used so that electrons may be transmitted through the material. The electrons are scattered by the sample and form a diffraction pattern characteristic of that material. A further series of lenses 5 can be used to form an image from the electron beams that had been scattered as they passed through the sample. The image or diffraction pattern may be viewed on a screen 6 coated with electron-fluorescent material, through a viewing window 7, or converted to a picture shown on a monitor via camera chamber 8. Alternatively, techniques for quantitative measurement of the electron intensity across the image may be employed. The whole TEM cavity is evacuated to a pressure of less than $10^{-2}$ Pa, to prevent the beam of electrons being disrupted by gas particles.

In order to obtain the high resolution that is often required in a TEM, the sample is generally positioned within the electromagnetic lenses or "pole pieces" 2c and 5a. The gap inside a high-resolution pole piece is small and this places a severe restriction on its maximum size: typically the sample 4 is a disc, 3 mm in diameter and with a maximum height of approximately 1 mm (FIG. 2). In order that electrons may be transmitted through the sample, specialist sample preparation techniques are used to thin the material to less than 100 nanometres. In most techniques, material is removed from the center of the sample disk using electro-polishing methods or ion thinning until a hole 10 is made in the center of the disk. A thin, electron-transparent area 11 surrounds the hole.

The prepared sample 4 is placed in a specimen holder 3 which extends through the wall of the TEM to hold the sample in the required location. The end of the specimen holder in which the sample is held is the specimen tip. This is generally an integral part of the specimen holder 3. A variety of specimen tips are available, examples of which are shown in FIGS. 3a, 3b and 3c. The sample is generally held in a circular recess 12 in the specimen tip, provided with a central aperture 13 intended to coincide with the hole 10 and surrounding electron-transparent region 11 of the sample 4. Often the tip is equipped with a thin mesh or grid which provides the sample with further support. Finally, the sample is held in place by a clip ring or similar mechanical fastening means. Available holders include heating and cooling stages, electrical stages which measure voltage and current in the specimen and straining stages. Examples of such stages are described in U.S. Pat. No. 5,225,683 which discloses various types of specimen tip with conventional clamping and tilting means which can be interchangeably mounted to a specimen holder.

Certain specialised techniques exist for mounting particular types of sample. For example, GB-A-2121208 describes a technique for freeze-drying and mounting cryosections. A pressure element is used to locate the specimen and, due to the applied pressure, the specimen becomes affixed to the mount during drying.

By combining a series of TEM images of a sample, it is possible to create a three-dimensional model of the specimen. This is termed "electron tomography" and is an important research tool since many complex specimens cannot be adequately described by a two-dimensional projection alone. For example, electron tomography is often used to image small single particles, such as catalysts or viruses.

In order to obtain the series of images required to form a 3-D model, the sample must be tilted through as large an angle as possible. Conventional specimen holders as described above, including those of U.S. Pat. No. 5,225,683, are bulky and, in the confined space within a high-resolution pole piece, do not generally allow the sample to be tilted by more than +/−40°. It would be advantageous for the holder size to be reduced so that the tilt range could be increased.

Furthermore, when tilting the sample it is important that the area of interest on the sample does not move out of focus or out of the viewing field. This is achieved by positioning the sample such that the point of interest is at the same height as the tilt axis. This is termed the "eucentric height". Conventionally standard holders are designed such that a standard size and thickness of sample will be approximately at the eucentric height when placed in the TEM. The height of the specimen holder relative to the TEM may be adjusted for focus in a goniometer which provides movement of the holder in 3 directions (x, y, z) with respect to the electron optics of the TEM. This is disclosed, for example, in JP2001-068047. However, due to the variation in the thickness of the sample, this technique does not guarantee that the sample is at the eucentric point and it would be advantageous if the z-axis height of the sample could be fine-tuned by the user.

U.S. Pat. No. 3,778,621 discloses a specimen tilting device for an electron microscope. The device provides for tilting of a mounted specimen about the X and Y axis, and lateral motion in the X axis (parallel to the axis of the device). The specimen stage may also be pivoted so as to move the specimen along an arcuate path in the XY or YZ planes. However the device is of a complex and delicate construction and does not provide the ability to fine-tune the Z-axis position of the specimen without moving the specimen in the XY plane also,

SUMMARY OF THE INVENTION

In accordance with a first aspect of the present invention, a specimen tip holder assembly for mounting a specimen tip in a transmission electron microscope comprises a tip holder for supporting a specimen tip, the tip holder being coupled to an elongate support for movement in a direction substantially perpendicular to the axis of the support, and an actuator mounted to the support for causing motion of the tip holder relative to the support.

By forming the tip holder assembly from two parts and providing actuating means, it is possible to displace the tip holder relative to the support perpendicularly to the axis of the support. This makes it possible to adjust the height of the specimen in the TEM, allowing fine-tuning of the eucentric point. In the description that follows, the term "specimen" ordinarily comprises the sample to be investigated, although it may also comprise an additional supporting object such as a mesh or grid, to which the sample is mounted in use. The height adjustment is incorporated into the specimen tip holder assembly and may be manually controlled by the user. This in situ height adjustment enables accurate and consistent setting of the specimen at the eucentric height. This means that whatever the specimen thickness, the height can be set to allow the same area of the specimen to remain in view (even at high magnification) and generally in focus whatever angle the holder is tilted to.

Preferably, the movement between the tip holder and the elongate support is substantially rectilinear. The adjustment takes place along a straight line in a single direction, avoiding any displacement in the other axes. For example, if the movement is substantially along the Z-axis (parallel to an optic axis of the TEM), the specimen height may be adjusted without lateral movement of the sample under examination. By having the Z-axis adjustment integrated into the specimen tip holder assembly, it is possible to set the microscope goniometer height to its optimum position for eccentricity and still maintain the correct focus position for the specimen. This also maximises the space available within the pole piece gap for tilting the specimen using the microscope goniometer.

Conveniently, the elongate support is provided with an elongate aperture or cavity extending in the direction of movement and the tip holder comprises a protrusion which slidably engages with the elongate aperture or cavity. This ensures accurate linear relative movement between the tip holder and elongate support. The elongate aperture or cavity guides the motion of the tip holder. Preferably, the elongate aperture or cavity extends parallel to an optic axis of the TEM (in the Z-axis).

It would be possible to operate the actuator using an internal mechanism. Preferably, however, the actuator is adapted to be operated from a location remote from the tip holder.

A number of different arrangements for achieving this height adjustment are conceivable, for example movement of the tip holder could be powered by a motor, piezo-electric drive, thermal expansion, lever or cantilever beam. Preferably, however, the actuator comprises a rotatable camshaft extending along the elongate support, arranged to engage a cam follower provided on a slide forming part of or coupled to the tip holder, such that the slide is caused to move in a direction substantially perpendicular to the axis of the support as the camshaft is rotated. This arrangement provides the operator with an easy and accurate way of controlling the height of the specimen and does not contain any complex parts which would require frequent maintenance. Conveniently, the slide forms a protrusion on the tip holder which slidably engages with an elongate aperture or cavity in the elongate support.

Generally, the elongate support is a barrel and the actuator extends within the barrel. This is a convenient arrangement, providing support and protection for the actuating means and resulting in a compact unit for fitting into a TEM.

Preferably, the barrel or other elongate support is further provided with internal sealing means which prevent the passage of gas between the camshaft and the barrel to maintain the vacuum in the TEM cavity. Alternatively, sealing means may be provided elsewhere in the tip holder assembly or left out of the design. However, it is convenient to position sealing means in the barrel where a good seal may be made between the camshaft and the barrel itself. This prevents entry of gas into the TEM through the tip holder assembly.

The tip holder may be integrally formed with a specimen tip. However, it is preferable that the tip holder is adapted to removably support a specimen tip. By making it possible to remove a specimen tip from the tip holder, interchangeable specimen tips may be used. Different styles of specimen tips may be chosen in accordance with the sample to be investigated and the TEM techniques to be employed. For example, many TEMs are equipped with X-ray analysis apparatus and may be used to carry out techniques such as energy dispersive spectroscopy (EDS). In such a case, it is advantageous if the side of the specimen tip which faces the EDS detector is cut back far enough not to be directly in the detector's path. This means that the detector will only receive signals from the sample material and mounting grid, should one be employed.

Once the specimen is mounted onto a specimen tip, the individual specimens can also be handled and stored as an assembly with the interchangeable specimen tip. It is further preferable that the specimen tip holder assembly further comprises a specimen tip.

In order to removably support a specimen tip, the tip holder could be provided with screw or clips with which to support the specimen tip. However, the tip holder is preferably provided with clamping means to removably support the specimen tip. There are various ways in which the specimen tip may be clamped to the tip holder, but preferably the tip holder comprises two members, coupled by a pivot pin, and biassing means for urging the two members towards one another, so as to clamp at least a portion of a specimen tip between them. This straightforward arrangement is easy to operate and will securely support the specimen tip in the TEM.

According to a second aspect of the invention, a specimen tip for supporting a specimen in a transmission electron microscope is provided with a substantially planar surface onto which a specimen is bonded, and a cut-out located underneath the specimen through which electrons may pass. Effectively, the tip is shaped so as to allow electrons to pass through the specimen without obstruction by the specimen tip. By bonding the specimen onto the specimen tip, it is possible to securely hold the specimen in place without a need for complex mechanical clips or cages which add bulk to the specimen holder. It is therefore possible to reduce the dimensions of the specimen tip, thereby allowing the specimen to be tilted through a greater angle in the confined space within the TEM pole piece. This arrangement can achieve high tilt angles such as +/−80° of sample tilt in small, high resolution pole piece gaps.

Robust samples may generally be mounted directly onto such a specimen tip. However, more fragile samples may require further support. The specimen in this case may therefore comprise a mounting grid to which the sample is bonded. In use, the specimen is then bonded to the planar surface of the specimen tip. Effectively, the specimen (which may include a mounting grid and a sample, or could comprise a sample alone) becomes an integral part of the specimen tip.

Advantageously, the tip holder of the specimen tip holder assembly supports a specimen tip as above described. The combination of an assembly provided with in situ height adjustment and reduced-size specimen tips provides a specimen holder particularly well adapted for carrying out electron tomography in an ultra high resolution TEM. The small specimen tips allow large angles of sample tilt inside the TEM, and the movement of the tip holder in a direction perpendicular to the axis of the barrel makes it possible to accurately fine tune the height of the specimen so that the point of interest is located at the eucentric height.

According to a further aspect of the invention, a transmission electron microscope has an evacuated cavity into which a specimen tip holder assembly according to the first aspect of the invention extends. Preferably, the actuating means are operable from outside of the evacuated cavity.

The invention also provides a method of mounting a specimen to a specimen tip for supporting a specimen in a transmission electron microscope, the method comprising the steps of:

a) applying adhesive to at least part of a planar surface on a specimen tip and/or to at least part of a specimen;

b) positioning the specimen on the specimen tip at a location such that the passage of electrons through an at least partially electron-transparent portion of the specimen is not disrupted by the specimen tip;.and c) bonding the positioned specimen to the specimen tip by means of the adhesive.

This mounting procedure requires no mechanical fixing components to be provided on the specimen tip. The size of the specimen tip can therefore be reduced and the tilt angles attainable inside the TEM increased. The specimen can also be handled and stored attached to the specimen tip, which protects the specimen and greatly increases its ease of handling. As previously discussed, if the sample is sufficiently robust, the specimen may comprise a sample alone. However, if the sample requires extra support, the specimen may further comprise a mounting grid to which the specimen is bonded. Therefore the method may further comprise the step of bonding the sample to the mounting grid prior to step (a).

At this stage the specimen is ready for use in the TEM. However, the size of the assembly may be further reduced by trimming the side portions of the sample and/or mounting grid. This may be performed either before or after mounting the specimen to the specimen tip. Therefore, the method may further comprise the step of removing at least some of the area of the specimen which overhangs or will overhang the specimen tip. Alternatively physically smaller specimens may be used. Each of the above may provide for improved angles of tilt for the specimen when mounted to the tip.

After analysis in the TEM, if desired, the specimen can be removed from the specimen tip by mechanical means or by soaking the tip in a suitable solvent in which the bonding agent will dissolve.

An example of a specimen holder assembly in accordance with the present invention incorporating a specimen tip in accordance with a second aspect of the present invention will now be described and contrasted with known specimen holders with reference to the accompanying drawings, in which:

BRIEF DESCRIPTION OF THE DRAWINGS

FIG. 2b is a cross section along a line X of the specimen shown in FIG. 2a;

FIG. 5 is a plan view of the specimen tip holder assembly and specimen tip shown in FIG. 4;

FIG. 6 is a side view of the specimen tip holder assembly and specimen tip shown in FIGS. 4 and 5;

FIG. 7a is an enlarged portion of FIG. 5;

FIG. 7b is a cross section of a portion of the specimen tip holder assembly and specimen tip illustrated in FIGS. 4 to 6, along the line Y shown in FIG. 7a;

FIG. 8a is a perspective view of an example of a specimen tip in accordance with a second aspect of the present invention, with the specimen removed for clarity;

FIG. 8b is a perspective view of a second example of a specimen tip in accordance with a second aspect of the invention, with the specimen removed for clarity;

FIG. 9a is a perspective view of a specimen tip with a specimen attached, and its sides trimmed; and FIG. 9b is a perspective view of a specimen tip with a mounting grid attached and its sides trimmed.

DETAILED DESCRIPTION OF THE INVENTION

Figure 4:
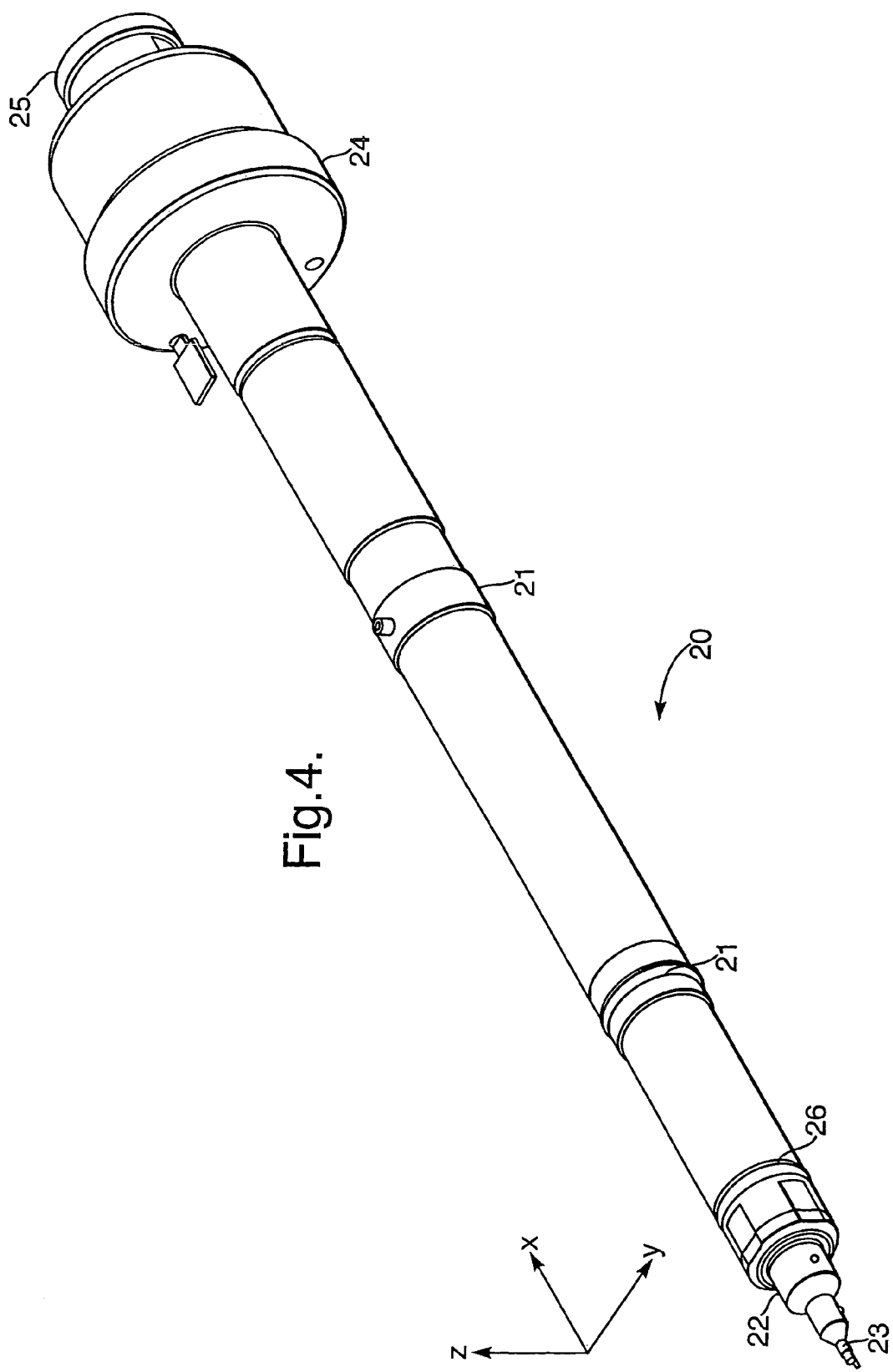
FIG. 4 is a perspective view of an example of a specimen tip holder assembly in accordance with the present invention, supporting an example of a specimen tip in accordance with a second aspect of the invention.

A specimen tip holder assembly for mounting a specimen tip in a transmission electron microscope (TEM) is illustrated in FIGS. 4, 5 and 6. The assembly 20 consists of a barrel 21, long enough to extend from the exterior of a TEM to the pole piece gap where the sample is positioned in use, and a tip holder 22 coupled to one end of the barrel 21. The tip holder 22 is adapted to support a specimen tip 23. In the Figures, the specimen tip is shown as a separate component, but it is envisaged that the specimen tip 23 could form an integral part of tip holder 22 if so desired. At its other end, the barrel is equipped with a housing 24 designed to fit against the side of a TEM, and a dial 25, discussed below. The assembly 20 is provided with polymeric sealing rings 26 which are fitted around the barrel in such a way that, when placed in a TEM, the passage of gas between the barrel and the TEM is prevented. This enables the TEM to maintain the high vacuum required for successful operation.

The tip holder 22 and the barrel 21 are coupled together in such a way that relative movement between the two components is possible in a direction perpendicular to the axis of the barrel. This arrangement is shown in FIG. 7b. Inside the barrel 21, there is a chamber 35 located adjacent to the end of the barrel 21 supporting tip holder 22 and defined by the inner walls of barrel 21, slide retainer 37a and end plate 37b. The chamber or cavity 35 is typically elongate in the direction of movement. The end plate 37b is welded, or otherwise attached, to the inside wall of the barrel 21, and is provided with a central aperture through which a rear portion of the tip holder 22 passes. The aperture is conveniently round but could be elongate in the direction of movement. This has the added benefit of preventing any accidental pivotal motion of the tip holder. The aperture is larger than the portion of the tip holder passing therethrough, to allow relative displacement of the tip holder. A slide 31 is disposed within chamber 35 in such a way that it is able to move up and down along a direction A. By re-orientating the slide and chamber arrangement (and aperture if necessary), it would be possible to move the slide back and forth in any direction perpendicular to the axis of the barrel 21.

The tip holder 22 is fixed to the slide 31 by means of a screw 34. This allows the tip holder to be easily removed for maintenance, replacement or storage. Other fixing methods could also be used, or alternatively the slide 31 could form an integral part of tip holder 22. The slide 31 and the portion of the tip holder 22 to which it is attached effectively form a protrusion on the tip holder 22 which slidably engages the aperture or cavity in the barrel 21.

A spring 33, or other means of imparting a biasing force to the slide 31 is disposed between the slide 31 and the base of the chamber 35. The slide 31 is provided with a cam follower 32 which abuts a cam shaft 36. The spring 33 forces the cam follower 32 against the cam shaft 36.

Cam shaft 36 is rotatably mounted within barrel 21 and extends from the slide 31 through the barrel 21 to the far end where the cam shaft 36 is coupled with dial 25. To enable rotation of camshaft 36, it is mounted in bearings. In this example, bushes (not shown) are used, but roller or alternative types of bearings may be employed. At its end 38, cam shaft 36 has an eccentric diameter, defining a cam, which contacts cam follower 32 on slide 31. Internal sealing rings 39 are positioned between the cam shaft 36 and the barrel 21 to prevent gas entering the TEM through the specimen holder.

On rotation of the cam shaft 36, slide 31 and tip holder 22 translate perpendicularly to the long axis of the barrel. The specimen 4 essentially follows a substantially rectilinear path in the Z-axis (substantially parallel to the optic axis A-A of the TEM). This avoids any displacement in the other axes so that the Z-height of the specimen 4 may be adjusted (and the beam focussed) without lateral movement of the specimen. The spring 33 ensures that the cam follower 32 and the cam (eccentric diameter) end 38 of the cam shaft 36 stay in contact with each other throughout the range of movement. The cam shaft may be rotated by turning dial 25 at the far end of the holder assembly 20. In this example, rotating the dial clockwise raises the slide 31, tip holder 22 and the specimen tip 23. Rotating the dial in a counter-clockwise direction lowers the components. Of course, the assembly could be arranged so that the directions are reversed. An operator can therefore adjust the z-axis position of a specimen mounted in the TEM by rotating the dial 25 at the rear of the holder assembly, outside of the microscope. Thus, the eucentric height may be fine-tuned without having to move the whole holder assembly 20 or having to re-focus the electron beam.

To ensure that the mechanism does not exceed its lowest or highest points of contact at minimum and maximum adjustment, there is a slot, at an angle such as 180°, machined into the dial face which mates with a pin (not shown) that protrudes from the housing 24. This ensures that the eccentric diameter is at its mid-point of contact at zero adjustment and that the cam shaft 36 cannot rotate through more than a certain angle, such as +/−90°. To aid the operators, and to improve the reproducibility of the specimen height setting, there is also a set of index marks 27 on the dial 25 and housing 24.

In one example, the total adjustment range is 760 microns along the z-axis. The slide travel is therefore limited to +/−380 microns. The adjustment range can of course be increased or decreased by varying the dimensions of the cam shaft 36 and the slide 31.

In this example, the tip holder is arranged such that the specimen tip 23 may be removed and replaced. The tip holder 22 is equipped with a movable clamping arm 28, coupled to the main body of the tip holder 22 via a pivot pin 29 and spring 30. The specimen tip 23 is retained in the tip holder 22 by sliding it into a hole in the end of the tip holder 22 and placing it between the clamping arm 28 and the main part of the tip holder 22.

The pin 29 extends across the full width of the tip holder 22 and retains the clamping arm 28 in a slot in the tip holder 22, permitting it to pivot. The spring 30 or alternative biasing means puts pressure on one end of the clamping arm 28 so that equal pressure is exerted on a flat surface machined onto the bottom of the specimen tip 23. The specimen tip 23 is then constrained from unwanted linear movement by the fit of the specimen tip 23 into the hole in the tip holder 22, the rear face of specimen 23 contacting a stop in the tip holder 22 and being held under spring pressure from the clamping arm 28. The specimen tip 23 is constrained from angular movement by the contacting flat surfaces of the specimen tip 23 and the clamping arm 28. An operator may release the clamping mechanism by applying slight pressure, for example with the end of a pair of tweezers, to a circular recessed area 28a on the spring end of the clamping arm 28. This pressure compresses the spring 30 and pivots the clamping arm 28, releasing pressure on the specimen tip 23.

Since the specimen tip 23 may be removed from the tip holder 22, it is possible to use interchangeable specimen tips. Different styles of specimen tip may be selected for different types of specimen material or different TEM techniques, as will be discussed in detail below.

FIGS. 8a and 8b show two examples of specimen tips which may be used in conjunction with the tip holder assembly described above to support a specimen in a transmission electron microscope. Each specimen tip 23a or 23b consists of a length of rigid material with a thin planar surface 40 at one end and a flat edge 42 adjacent to the other. The tip material may be selected according to its intended application. For example, titanium would be adequate for most applications but for X-ray microanalysis, beryllium is preferable. The planar area may be provided with a cut-out such as 41a or 41b or may be otherwise shaped so as to allow passage of electrons through the specimen 4 unimpeded by the tip 23. The specimen tips 23a and 23b shown respectively in FIGS. 8a and 8b are illustrated without the specimen attached so as to clearly show the structure of the supporting tip itself.

Figure 1:
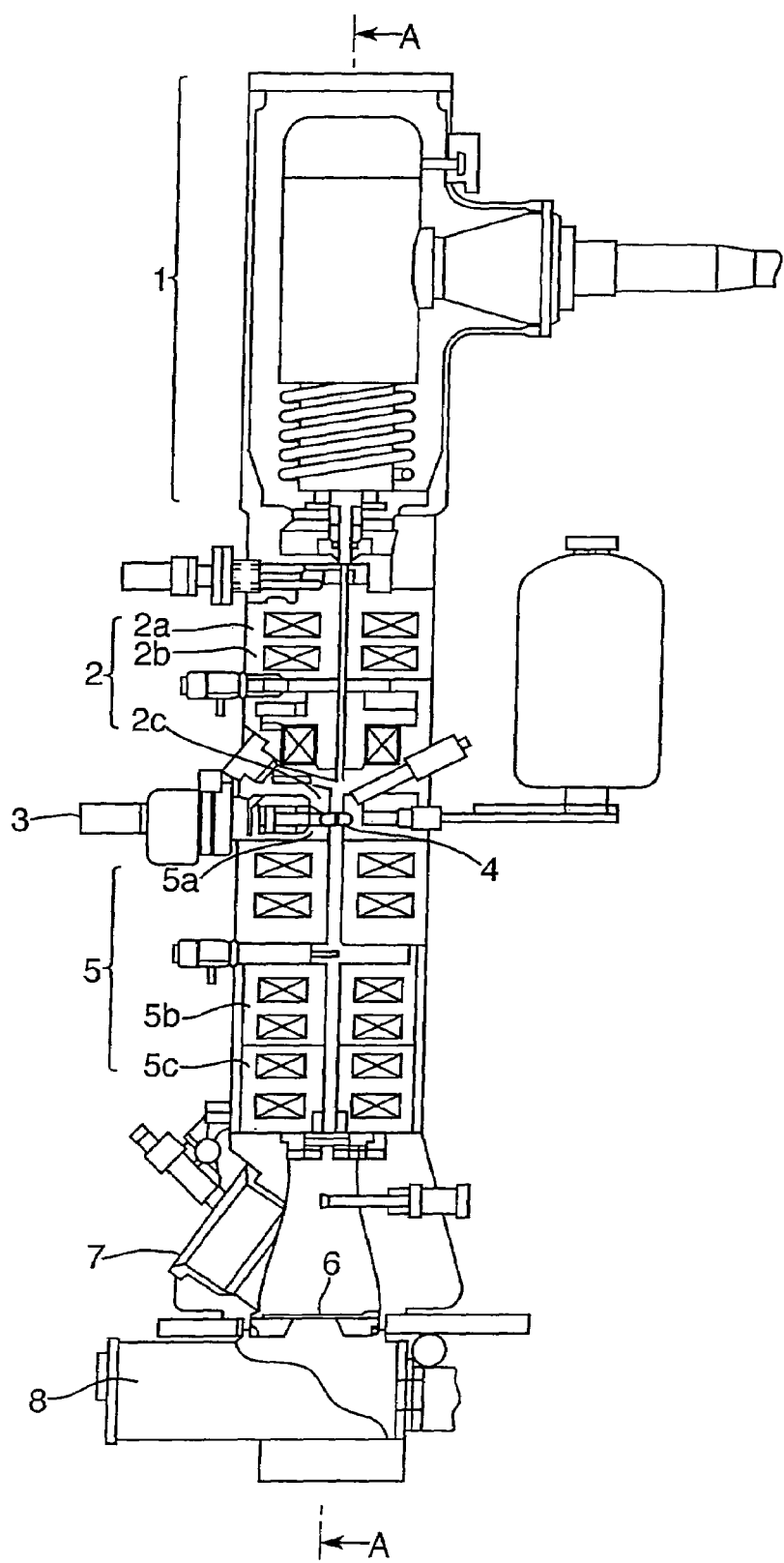
FIG. 1 is a schematic diagram illustrating the workings of a conventional transmission electron microscope.
Figure 2A:
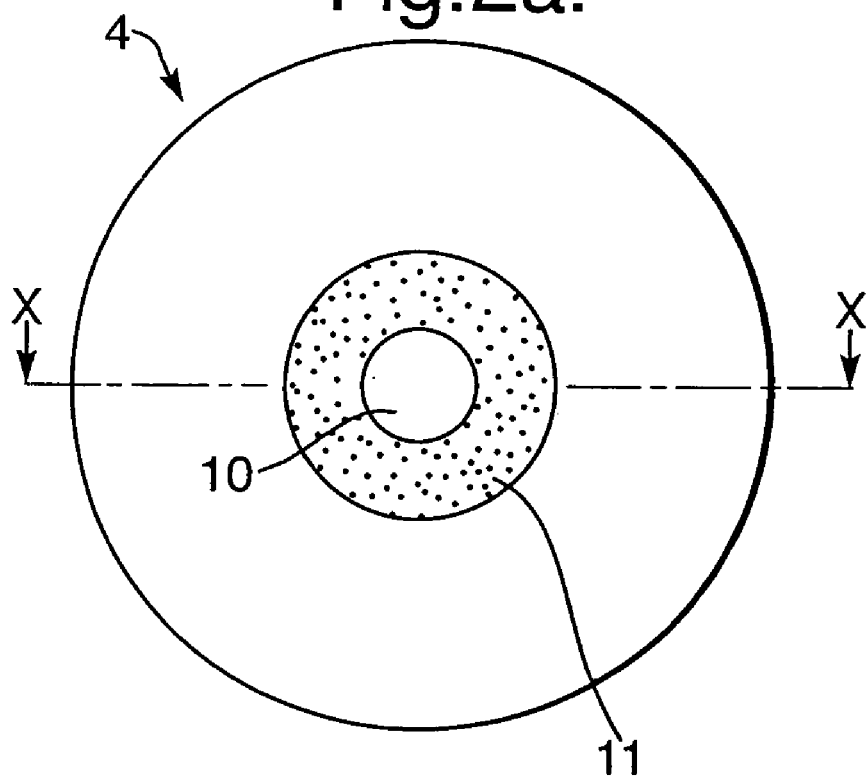
FIG. 2a is a plan view of a typical specimen prepared for analysis in a TEM.
Figure 2B:
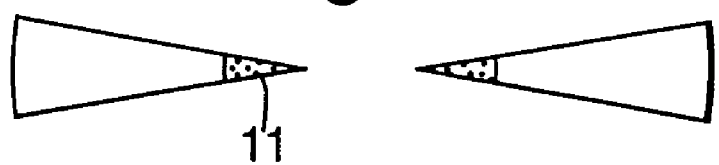
Figure 3A:
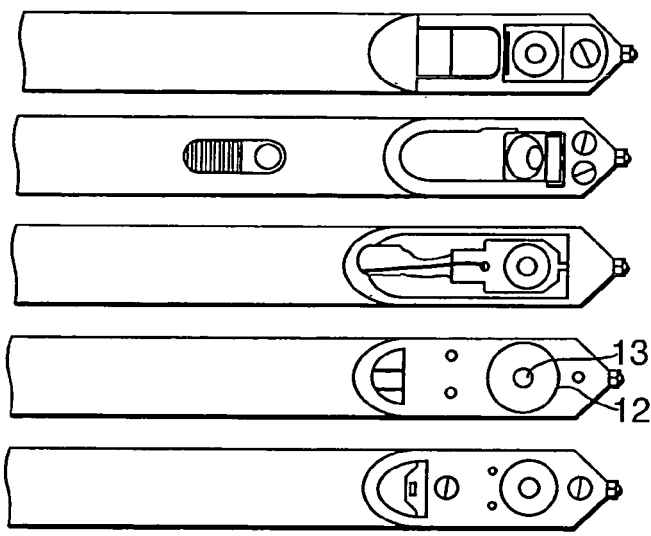
FIGS. 3a, 3b and 3c illustrate the end portions of a variety of conventional specimen holders.
Figure 3B:
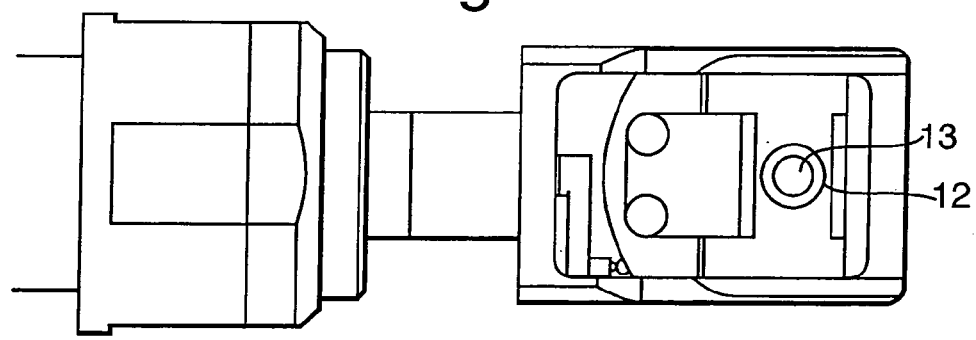
Figure 3C:
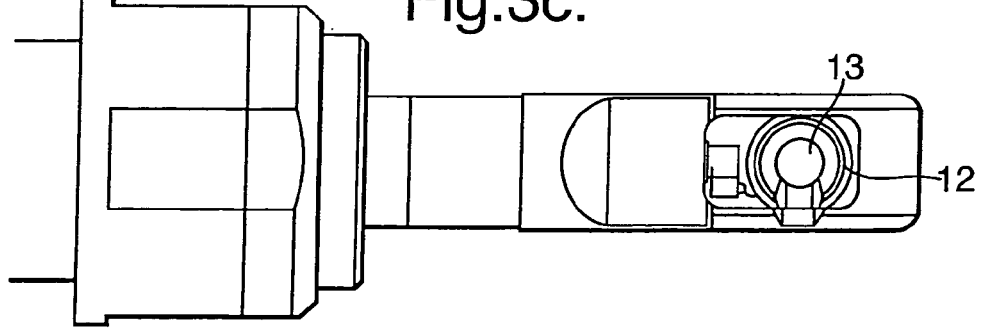

A standard prepared TEM specimen 4, such as that shown in FIG. 2, is positioned on the planar surface 40 so that the hole 10 and electron transparent region 11 of the specimen 4 are located above cut-out 41a or 41b. The completed assembly is shown in FIG. 9a in which the edges of the specimen 4 have been trimmed for reasons which will be discussed below. This step is however optional. By carefully positioning the specimens 4 as shown, in use the electron beam transmitted through the specimen will not be intercepted by the specimen tip 23. The specimen 4 is bonded into position on the specimen tip 23 by means of an adhesive or other bonding agent.

The flat surface 42 at the rear end of the specimen tip can be used to help mount the specimen tip 23 in a tip holder such as that described above.

By bonding the specimen 4 to the specimen tip 23 rather than using clips or other mechanical fixing means, the size of the specimen tip may be significantly reduced. Indeed, the need for any sort of specimen clamping or locating mechanism is eliminated thus allowing a much thinner tip profile to fit between the narrow gap of the TEM pole pieces. In the example shown, the specimen tip 23 is 1.5 mm in diameter. Unlike conventional specimen holders, it is possible that the specimen tip 23 may be smaller than the specimen 4 mounted to it (typically 3 mm diameter), since no allowance need be made for mechanical fixing apparatus. The reduced-sized specimen tip makes it possible to significantly increase the specimen tilt angles attainable in the TEM.

The specimen 4 in the form of a sample to be investigated, may be mounted directly to a specimen tip 23 as shown in FIG. 9a. However, the required specimen dimensions often result in a sample being fragile and requiring extra support on a specimen tip. Therefore a mounting grid 9 may be used (to which the sample is bonded). This can then be bonded to the surface 40 of the tip 23. FIG. 9b shows a mounting grid 9 and sample (not shown) bonded to a specimen tip, trimmed as per FIG. 9a.

If desired, the size of the specimen tip assembly may be further reduced by trimming the left and right edges of the specimen sample or grid such that they are flush to the sides of the tip as depicted in FIGS. 9a and 9b. This can be carried out before or after the specimen is bonded to the specimen tip. Alternatively the sample could be prepared to a reduced size (e.g. a 1.5 mm diameter disk) before attachment. Such an arrangement can achieve +/−80% of sample tilt in small, high-resolution pole piece gaps. The increased tilt range enables TEM images of the specimen to be obtained over a very wide range of angles and is of particular use when carrying out techniques such as electron tomography.

Once bonded, the individual specimens can be handled and stored as an assembly with the interchangeable specimen tip 23. By bonding the specimen to the specimen tip 23, the tip 23 effectively becomes the specimen and is much easier to handle, being much more rigid than the specimen 4 alone. This protects delicate specimens and also improves reproducibility of results obtained in the TEM since it allows the specimen to be accurately repositioned each time examination is carried out. If desired, the specimen can be removed by mechanical means or by soaking the tip in a suitable solvent for the bonding agent.

Various styles of specimen tip 23 may be used with the tip holder assembly described above. In FIG. 8, a J-shaped tip 23a and a C-shaped tip 23b are illustrated. Both tips are machined to facilitate energy dispersive spectroscopy (EDS) analysis. The area of the specimen tip which when in use would face the EDS detector is removed so as not to be directly in the detector's path. The EDS detector will then only receive signals from the sample and grid materials and will not be contaminated with signals from the specimen tip itself.

The C-shaped tip 23b should be compatible with most mounting grids and specimens. The J-shaped tip 23a offers some more support for thin mounting grids and fragile specimens. Other tip designs, to suit specific types, shapes and sizes of specimen are envisaged, including a full-circle aperture for use with particularly thin specimens or in situations where EDS analysis is not to be carried out. The interchangeable specimen tips 23 may be reusable or disposable tailored to the specimen type in use.

I claim:

1. A specimen tip holder assembly for mounting a specimen tip in a transmission electron microscope (TEM), the specimen tip holder assembly comprising a tip holder for supporting a specimen tip, the tip holder being coupled to an elongate support for movement in a direction substantially perpendicular to the axis of the support, and an actuator mounted to the support for causing motion of the tip holder relative to the support.

2. A specimen tip holder assembly according to claim 1 wherein the movement between the tip holder and the elongate support is substantially rectilinear.

3. A specimen tip holder assembly according to claim 1 wherein the movement between the tip holder and the elongate support is substantially parallel to an optic axis of the TEM.

4. A specimen tip holder assembly according to claim 1 wherein the elongate support is provided with an elongate aperture or cavity extending in the direction of movement, and the tip holder comprises a protrusion which slidably engages with the elongate aperture or cavity.

5. A specimen tip holder assembly according to claim 4 wherein the elongate aperture or cavity extends in a direction substantially parallel to an optic axis of the TEM.

6. A specimen tip holder assembly according to claim 1 wherein the actuator is adapted to be operated from a location remote from the tip holder.

7. A specimen tip holder assembly according to claim 1 wherein the tip holder is adapted to removably support a specimen tip.

8. A specimen tip holder assembly according to claim 1 which further comprises a specimen tip.

9. A specimen tip holder assembly according to claim 7 wherein the tip holder is provided with clamping means to removably support the specimen tip.

10. A specimen tip holder assembly according to claim 7 wherein the tip holder comprises two members, coupled by a pivot pin, and biassing means for urging the two members towards one another, so as to clamp at least a portion of a specimen tip between them.

11. A specimen tip holder assembly according to claim 1 wherein the elongate support is a barrel, and the actuator extends within the barrel.

12. A specimen tip holder assembly according to claim 1 wherein the actuator comprises a rotatable camshaft extending along the elongate support, arranged to engage a cam follower provided on a slide forming part of or coupled to the tip holder, such that the slide is caused to move in a direction substantially perpendicular to the axis of the support as the camshaft is rotated.

13. A specimen tip holder assembly according to claim 12 wherein the support is further provided with sealing means which prevent the passage of gas between the camshaft and the elongate support.

14. A transmission electron microscope having an evacuated cavity into which a specimen tip holder assembly according to claim 1 extends.

15. A transmission electron microscope according to claim 14 wherein the actuator is operable from outside of the evacuated cavity.

* * * * *

UNITED STATES PATENT AND TRADEMARK OFFICE
CERTIFICATE OF CORRECTION

PATENT NO. : 7,291,847 B2  
APPLICATION NO. : 11/546268  
DATED : June 13, 2006  
INVENTOR(S) : Morrison Page 1 of 1

It is certified that error appears in the above-identified patent and that said Letters Patent is hereby corrected as shown below:

Title Page, Insert

(60) Related U.S. Application Data:

Ser. No. 10/903,985, filed on July 30, 2004, by Robert Morrison,

Related Foreign Application Data:

U.K. application Ser. No. 0318134.4, filed on August 1, 2003 by Robert Morrison

Signed and Sealed this

Fourteenth Day of October, 2008

JON W. DUDAS  
*Director of the United States Patent and Trademark Office*

UNITED STATES PATENT AND TRADEMARK OFFICE
CERTIFICATE OF CORRECTION

PATENT NO. : 7,291,847 B2  
APPLICATION NO. : 11/546268  
DATED : November 6, 2007  
INVENTOR(S) : Morrison Page 1 of 1

It is certified that error appears in the above-identified patent and that said Letters Patent is hereby corrected as shown below:

Title Page, Insert

<u>(60) Related U.S. Application Data:</u>

<u>Ser. No. 10/903,985, filed on July 30, 2004, by Robert Morrison,</u>

<u>Related Foreign Application Data:</u>

<u>U.K. application Ser. No. 0318134.4, filed on August 1, 2003 by Robert Morrison</u>

This certificate supersedes the Certificate of Correction issued October 14, 2008.

Signed and Sealed this

Fourth Day of November, 2008

JON W. DUDAS  
*Director of the United States Patent and Trademark Office*